United States Patent
Aga et al.

(10) Patent No.: US 11,952,286 B2
(45) Date of Patent: Apr. 9, 2024

(54) MN FERRITE POWDER, RESIN COMPOSITION, ELECTROMAGNETIC WAVE SHIELDING MATERIAL, ELECTRONIC MATERIAL, AND ELECTRONIC COMPONENT

(71) Applicant: POWDERTECH CO., LTD., Kashiwa (JP)

(72) Inventors: Koji Aga, Chiba (JP); Takashi Kojima, Chiba (JP); Kazutaka Ishii, Chiba (JP); Tetsuya Igarashi, Chiba (JP); Sho Kuwahara, Chiba (JP)

(73) Assignee: POWDERTECH CO., LTD. (JP)

( * ) Notice: Subject to any disclaimer, the term of this patent is extended or adjusted under 35 U.S.C. 154(b) by 812 days.

(21) Appl. No.: 16/967,197

(22) PCT Filed: Feb. 6, 2019

(86) PCT No.: PCT/JP2019/004301
§ 371 (c)(1),
(2) Date: Aug. 4, 2020

(87) PCT Pub. No.: WO2019/159797
PCT Pub. Date: Aug. 22, 2019

(65) Prior Publication Data
US 2021/0047200 A1 Feb. 18, 2021

(30) Foreign Application Priority Data
Feb. 13, 2018 (JP) ................. 2018-023565

(51) Int. Cl.
| | |
|---|---|
| C01G 49/00 | (2006.01) |
| C08K 3/22 | (2006.01) |
| C08L 29/04 | (2006.01) |
| H01F 1/34 | (2006.01) |
| H01F 1/37 | (2006.01) |
| H05K 9/00 | (2006.01) |

(52) U.S. Cl.
CPC .......... C01G 49/0072 (2013.01); C08L 29/04 (2013.01); H01F 1/344 (2013.01); H01F 1/37 (2013.01); H05K 9/0081 (2013.01); *C01P 2004/32* (2013.01); *C01P 2004/51* (2013.01); *C01P 2004/61* (2013.01); *C01P 2006/11* (2013.01); *C01P 2006/12* (2013.01); *C08K 3/22* (2013.01); *C08K 2201/005* (2013.01); *C08K 2201/006* (2013.01); *C08K 2201/01* (2013.01)

(58) Field of Classification Search
CPC ........ C08K 2201/005; C08K 2201/006; C08K 2201/01; C01G 49/0072; H01F 1/37; H01F 1/344; H05K 9/6081; C01P 2004/61; C01P 2004/51; C01P 2004/32; C01P 2006/12
See application file for complete search history.

(56) References Cited

U.S. PATENT DOCUMENTS

| | | |
|---|---|---|
| 9,703,223 B2 | 7/2017 | Okubo et al. |
| 2002/0017628 A1 | 2/2002 | Akimoto et al. |
| 2010/0295643 A1 | 11/2010 | Nakaue et al. |
| 2011/0111337 A1 | 5/2011 | Horie et al. |
| 2016/0026105 A1 | 1/2016 | Tsurumi et al. |
| 2017/0309381 A1 | 10/2017 | Tsuboi et al. |
| 2018/0179082 A1 | 6/2018 | Aga et al. |
| 2019/0161362 A1* | 5/2019 | Kojima .................. C08K 7/18 |
| 2019/0300379 A1 | 10/2019 | Kojima et al. |

FOREIGN PATENT DOCUMENTS

| | | |
|---|---|---|
| JP | H11-130524 A | 5/1999 |
| JP | 2002-025816 A | 1/2002 |
| JP | 2006-269892 A | 10/2006 |
| JP | 2006-286729 A | 10/2006 |
| JP | 2009-099969 A | 5/2009 |
| JP | 2010-184840 A | 8/2010 |
| JP | 2016-060682 A | 4/2016 |
| JP | 2017-178718 | * 10/2017 |
| JP | 2017-178718 A | 10/2017 |
| JP | 2017-201693 A | 11/2017 |
| WO | WO-2016/052681 A1 | 4/2016 |
| WO | WO-2017/212997 A1 | 12/2017 |

OTHER PUBLICATIONS

Sam, et al., "Preparation of MnFe2O4 Nanoceramic Particles by Soft Chemical Routes", International Journal of Applied Science and Engineering, Jan. 2011, pp. 223-239.
International Searching Authority, "International Search Report," issued in connection with International Patent Application No. PCT/JP2019/004301, dated Mar. 26, 2019.
Glossary Subsieve distribution.
Particle size distribution dependent on measurement principle_ Analytical measuring instruments (analyzers) Shimadzu Corporation (3 pages).

* cited by examiner

*Primary Examiner* — C Melissa Koslow
(74) *Attorney, Agent, or Firm* — Foley & Lardner LLP

(57) ABSTRACT

Provided are: an Mn ferrite powder characterized by including a plurality of ferrite particles, having a volume-average particle diameter of 1-10 μm, and having a 2.106 μm volume-based cumulative distribution (sieved) of 0.1-50.0 vol %; and a resin composition characterized by including said powder and a resin material.

8 Claims, 1 Drawing Sheet

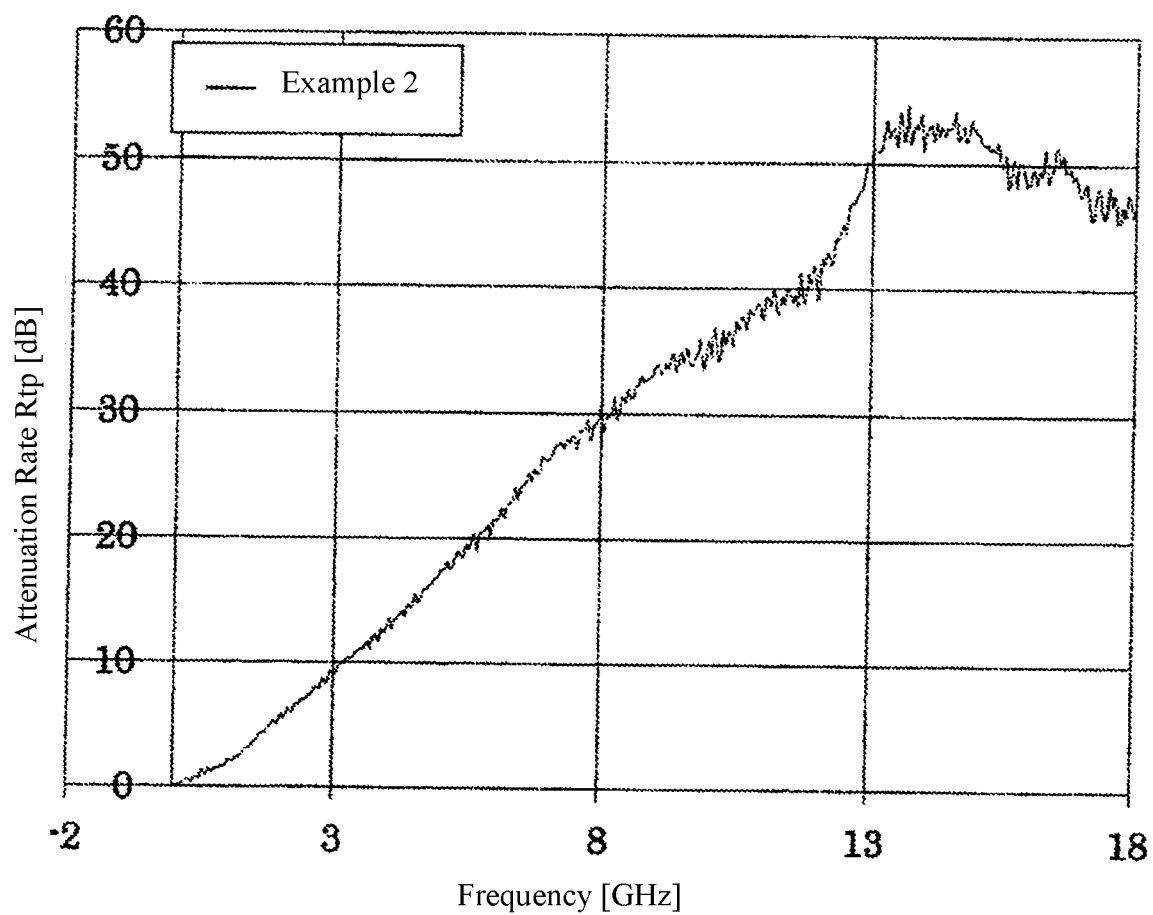

MN FERRITE POWDER, RESIN COMPOSITION, ELECTROMAGNETIC WAVE SHIELDING MATERIAL, ELECTRONIC MATERIAL, AND ELECTRONIC COMPONENT

RELATED APPLICATIONS

The present application claims priority under 37 U.S.C. § 371 to International Patent Application No. PCT/JP2019/004301, filed Feb. 6, 2019, which claims priority to and the benefit of Japanese Patent Application No. 2018-023565, filed on Feb. 13, 2018. The contents of these applications are hereby incorporated by reference in their entireties.

TECHNICAL FIELD

The present invention relates to a Mn ferrite powder, a resin composition, an electromagnetic wave-shielding material, an electronic material, and an electronic component.

BACKGROUND ART

It is known to use a ferrite powder in an electromagnetic wave-shielding material (see, e.g., Patent Literatures 1, 2, and 3).

As the electromagnetic wave-shielding material using a ferrite powder, an electromagnetic wave-shielding material obtained by molding a resin composition containing a ferrite powder into a sheet shape may be considered. When the sheet-shaped electromagnetic wave-shielding material is attached to a digital electronic device such as a personal computer and a mobile phone, which requires to shield electromagnetic waves, the leakage of electromagnetic waves to the outside of the electronic device can be prevented, the mutual interference of electromagnetic waves between circuits inside the electronic device can be prevented, or malfunction of the electronic device due to external electromagnetic waves can be prevented.

In order to use a ferrite powder as an electromagnetic wave shield for electronic devices, it is desired that electromagnetic waves in a wide frequency band can be shielded. Particularly, in recent years, an excellent electromagnetic wave-shielding property in a high-frequency band has been demanded. However, conventional electromagnetic wave-shielding materials only have an electromagnetic wave-shielding property insufficient in a high-frequency band (e.g., a frequency band of more than 1 GHz and 12 GHz or less).

In addition, ferrite particles having a specific size and crystal structure are also known (e.g., Patent Literature 4), but even when such ferrite particles are used, satisfactory results cannot be obtained.

CITATION LIST

Patent Literature

Patent Literature 1: JP-A-2006-286729
Patent Literature 2: JP-A-2016-060682
Patent Literature 3: JP-A-2002-25816
Patent Literature 4: JP-A-2017-178718

SUMMARY OF INVENTION

Technical Problem

Objects of the present invention are: to provide a Mn ferrite powder, which has an excellent shielding property against electromagnetic waves in a low-frequency region of 1 GHz or less, and has excellent shielding property against electromagnetic waves in a high-frequency region of more than 1 GHz and 12 GHz or less; to provide an electromagnetic wave-shielding material, an electronic material, and an electronic component, which have an excellent shielding property against electromagnetic waves in a low-frequency region of 1 GHz or less, and have an excellent shielding property against electromagnetic waves in a high-frequency region of more than 1 GHz and 12 GHz or less; and to provide a resin composition, which can be suitably used for producing the electromagnetic wave-shielding material, the electronic material, and the electronic component.

Solution to Problem

These objects are achieved by the present invention described below.

[1] A Mn ferrite powder,
  containing a plurality of ferrite particles,
  having a volume average particle diameter of 1 μm or more and 10 μm or less, and
  having a volume-based cumulative distribution at 2.106 μm (under a sieve) of 0.1 vol % or more and 50.0 vol % or less.

[2] The Mn ferrite powder according to [1], having a BET specific surface area of 0.35 $m^2$/g or more and 9 $m^2$/g or less.

[3] The Mn ferrite powder according to [1] or [2], in which the ferrite particles have a true spherical shape, or a shape whose cross section is a hexagonal or more polygonal shape.

[4] The Mn ferrite powder according to any one of [1] to [3], having a Mn content of 4 mass % or more and 13 mass % or less, and a Fe content of 60 mass % or more and 68 mass % or less.

[5] A resin composition containing: the Mn ferrite powder as described in any one of [1] to [4]; and a resin material.

[6] An electromagnetic wave-shielding material, formed of a material containing the Mn ferrite powder as described in any one of [1] to [4] and a resin material.

[7] An electronic material, formed of a material containing the Mn ferrite powder as described in any one of [1] to [4].

[8] An electronic component, formed of a material containing the Mn ferrite powder as described in any one of [1] to [4].

Advantageous Effects of Invention

According to the present invention, it is possible to provide a Mn ferrite powder, which has an excellent shielding property against electromagnetic waves in a low-frequency region of 1 GHz or less, and has an excellent shielding property against electromagnetic waves in a high-frequency region of more than 1 GHz and 12 GHz or less; it is possible to provide an electromagnetic wave-shielding material, an electronic material, and an electronic component, which have an excellent shielding property against electromagnetic waves in a low-frequency region of 1 GHz or less, and have an excellent shielding property against electromagnetic waves in a high-frequency region of more than 1 GHz and 12 GHz or less; and it is possible to provide a resin composition, which can be suitably used for producing the electromagnetic wave-shielding material, the electronic material, and the electronic component.

BRIEF DESCRIPTION OF DRAWINGS

The FIGURE is a graph showing measurement results of electromagnetic wave-shielding capacity (transmission attenuation factor measurement method) of a molded body according to Example 2.

DESCRIPTION OF EMBODIMENTS

Hereinafter, preferred embodiments of the present invention will be described in detail.

(Mn Ferrite Powder)

First, the Mn ferrite powder of the present invention will be described.

Although electromagnetic wave-shielding materials containing a ferrite powder have been widely used, conventional electromagnetic wave-shielding materials cannot sufficiently meet the recent demand for the electromagnetic wave-shielding property in a high-frequency band.

Therefore, the present inventors have conducted earnest research for the purpose of solving the above-mentioned problems, and as a result, have completed the present invention.

That is, the Mn ferrite powder (hereinafter, also simply referred to as "ferrite powder") of the present invention contains a plurality of ferrite particles, and has a volume average particle diameter of 1 μm or more and 10 μm or less and a volume-based cumulative distribution at 2.106 μm (under a sieve) of 0.1 vol % or more and 50.0 vol % or less.

Accordingly, it is possible to shift the point of the frequency at which μ' is less than 1 to the higher side at a frequency higher than 1 GHz. As a result, it is possible to provide a ferrite powder having an excellent shielding property against electromagnetic waves in a high-frequency region of higher than 1 GHz.

Furthermore, the ferrite powder of the present invention has an excellent shielding property against electromagnetic waves in a low-frequency region of 1 GHz or less.

When the particle diameter conditions as described above are satisfied, the flowability and the ease of handling of the ferrite powder and a resin composition containing the ferrite powder can be made excellent. As a result, for example, the productivity of an electromagnetic wave-shielding material or the like (including an electronic material, an electronic component and the like, and the same applies hereinafter) containing the ferrite powder can be made excellent. In addition, it is possible to effectively prevent the occurrence of unintentional compositional variations in respective parts of the electromagnetic wave-shielding material or the like. Furthermore, it is possible to increase the filling rate (content) of the ferrite powder in the electromagnetic wave-shielding material or the like while ensuring excellent moldability. Therefore, the ferrite powder can be suitably used for producing an electromagnetic wave-shielding material or the like having an excellent shielding property against electromagnetic waves in a high-frequency region of more than 1 GHz and 12 GHz or less.

Furthermore, when the composition as described above is contained, it is possible to achieve both a high magnetic permeability and a low coercive force at a high level.

On the other hand, in the case where the above-described conditions are not satisfied, satisfactory characteristics cannot be obtained.

For example, in the case where the volume average particle diameter of the ferrite powder (specifically, the volume average particle diameter of all particles constituting the ferrite powder, and the same applies hereinafter) is less than the above-mentioned lower limit value, the flowability of the ferrite powder and the flowability of the resin composition containing the ferrite powder are reduced. In addition, aggregation of particles is likely to occur, and it is not possible to sufficiently improve the reliability (including the shielding property against electromagnetic waves in a high-frequency region of more than 1 GHz and 12 GHz or less) of an electromagnetic wave-shielding material or the like produced by using the ferrite powder.

In addition, in the case where the volume average particle diameter of the ferrite powder is larger than the above-mentioned upper limit value, voids between the ferrite particles are large, and the ferrite particles filled in the voids is insufficient, so that the voids tend to remain, and it is difficult to increase the magnetic permeability.

In the case where the volume average particle diameter is not within a range of 1 μm or more and 10 μm or less, the magnetic permeability at 1 MHz to 1 GHz cannot be increased.

In the case where the ferrite powder has a volume-based cumulative distribution at 2.106 μm (under a sieve) being less than the above-mentioned lower limit value, the magnetic permeability of the ferrite powder cannot be made sufficiently excellent, and the absorptivity for electromagnetic waves in a high-frequency region of more than 1 GHz and 12 GHz or less cannot be made sufficiently excellent.

In addition, in the case where the ferrite powder has a cumulative volume % at 2.106 μm being larger than the above-mentioned upper limit value, the flowability of the ferrite powder and the flowability of the resin composition containing the ferrite powder are reduced. In addition, the aggregation of the particles is likely to occur, and it is not possible to sufficiently improve the reliability (including the shielding property against electromagnetic waves in a high-frequency region of more than 1 GHz and 12 GHz or less) of an electromagnetic wave-shielding material or the like produced by using the ferrite powder.

Furthermore, in the case where the ferrite powder has a cumulative volume % at 2.106 μm being less than the above-mentioned lower limit value, the magnetic permeability of the ferrite powder cannot be made sufficiently excellent, and the absorptivity for electromagnetic waves in a high-frequency region of more than 1 GHz and 12 GHz or less cannot be made sufficiently excellent. In addition, in the electromagnetic wave-shielding material or the like produced by using the ferrite powder, undesired irregularities are likely to occur on the surface.

In the case where the ferrite powder does not contain a Mn-based composition, in the production of the Mn ferrite powder, a large amount of $Fe^{2+}$ is generated in the ferrite particles during thermal spraying, which easily oxidizes after the thermal spraying, resulting in problems of poor magnetic characteristics. The content of $Fe^{2+}$ is preferably 0 mass % or more and 10 mass % or less, more preferably 0 mass % or more and 7 mass % or less, and still more preferably 0 mass % or more and 5 mass % or less.

The content of $Fe^{2+}$ in the ferrite powder is determined by redox titration with potassium permanganate.

The particle diameter distribution described in the present description means a volume particle diameter distribution, and the volume average particle diameter and the particle diameter distribution (volume particle diameter distribution) are determined by the following measurements. That is, first, a ferrite powder as a sample: 10 g and water: 80 ml are charged into a 100 ml-beaker, and 2 drops of a dispersant (sodium hexametaphosphate) is added thereto. Next, dispersion is performed by using an ultrasonic homogenizer (Model UH-150 manufactured by SMT. Co. LTD.). In the Model UH-150 manufactured by SMT. Co. LTD., as the ultrasonic homogenizer, the output level is set to 4 and dispersion is performed for 20 seconds. Thereafter, bubbles formed on the surface of the beaker are removed and the beaker is introduced into a laser diffraction type particle diameter distribution measurement device (SALD-7500 nano manufactured by Shimadzu Corporation) to perform a measurement under the conditions of a refractive index of 1.70 to 0.50i and an absorbance of 0.04 to 0.12. Automatic analysis is performed by using the particle diameter division 101CH of the attached software, and the volume average particle diameter, the particle diameter distribution (volume particle diameter distribution), and the volume-based cumulative distribution at 2.106 µm (under a sieve) are measured.

In addition, the magnetic permeability (the real part µ' and the imaginary part µ" of the complex relative magnetic permeability) in the region where the frequency is more than 1 GHz and 12 GHz or less is determined as follows.

That is, 70 parts by mass of a ferrite powder is mixed with 30 parts by mass of an epoxy resin, then the mixture is poured into a cylindrical mold having an inner diameter of 1.8 mm and a length of 100 mm, and then cured by heating. After returning the mold to room temperature, a round bar-shaped sample is taken out from the mold and used as a magnetic permeability measurement sample.

Then, the sample is set in a resonator, the magnetic permeability is measured by using a cavity resonator (for S band and C band, manufactured by KANTO Electronic Application and Development Inc.) and a network analyzer (E5071C manufactured by Keysight Technologies), and the obtained value is adopted as the value of the magnetic permeability of the ferrite powder.

The volume average particle diameter of the ferrite powder is 1 µm or more and 10 µm or less, preferably 1 µm or more and 5 µm or less, more preferably 1 µm or more and 3.5 µm or less, and still more preferably 1 µm or more and 3 µm or less.

Accordingly, the effects described above are more remarkably exhibited.

In the ferrite powder, the volume-based cumulative distribution at 2.106 µm (under a sieve) is 0.1 vol % or more and 50.0 vol % or less, preferably 0.1 vol % or more and 30.0 vol % or less, and more preferably 0.1 vol % or more and 20.0 vol % or less.

Accordingly, the effects described above are more remarkably exhibited.

The particle diameter of the ferrite particles constituting the ferrite powder is preferably 1 nm or more and 2,106 nm (2.106 µm) or less. The ferrite particles having a particle diameter of 1 nm or more and 2,106 nm or less are generally single crystal particles (single crystal ferrite particles), but may also be polycrystal particles (polycrystal ferrite particles).

As a method for confirming the single crystal, a selected area electron diffraction image is taken with a TEM in a field of view where only a plurality of the particles having the above-mentioned particle diameter are present, and whether a spot-like pattern in the obtained image is clearer than or same as a annular pattern is determined. (The image is taken at 100,000 magnification with Vacc: 200 kV, by using HF-2100 and Cold-FE-TEM, manufactured by Hitachi High-Technologies Corporation.)

The particle diameter of the single crystal ferrite particles constituting the ferrite powder is preferably 1 nm or more and 2,000 nm or less, more preferably 10 nm or more and 1,000 nm or less, and still more preferably 10 nm or more and 500 nm or less.

Accordingly, the effects described above are more remarkably exhibited.

The ferrite powder of the present invention preferably has a Mn content of 4 mass % or more and 13 mass % or less and a Fe content of 60 mass % or more and 68 mass % or less.

Accordingly, the magnetic characteristics can be easily adjusted during firing (during thermal spraying).

The Mn content in the ferrite powder is preferably 4 mass % or more and 13 mass % or less, more preferably 4 mass % or more and 11 mass % or less, and still more preferably 5 mass % or more and 10 mass % or less.

Accordingly, the effects described above are more remarkably exhibited.

In addition, the Fe content in the ferrite powder of the present invention is preferably 60 mass % or more and 68 mass % or less, more preferably 60 mass % or more and 65 mass % or less, and still more preferably 61 mass % or more and 65 mass % or less.

Accordingly, the effects described above are more remarkably exhibited.

It is desirable that the Mn ferrite contains only Fe and Mn as metal components. From this viewpoint, it is desirable that the content of all components (elements) other than Fe, Mn, and O contained in the Mn ferrite does not exceed the amount of impurities.

Specifically, the content of all components (elements) other than Fe, Mn, and O contained in the Mn ferrite is preferably less than 0.1 mass %, more preferably less than 0.05 mass %, and still more preferably less than 0.01 mass %.

The content of each metal element constituting the ferrite powder is determined by measurement using an ICP analyzer.

More specifically, 0.2 g of a ferrite powder is weighed, and 60 mL of pure water to which 20 mL of 1N hydrochloric acid and 20 mL of 1N nitric acid are added is heated, to prepare an aqueous solution in which the ferrite powder is completely dissolved. Thereafter, the aqueous solution is measured by using an ICP analyzer (ICPS-1000IV manufactured by Shimadzu Corporation) to determine the content of each metal element.

The shape of the ferrite particles is not particularly limited, and may preferably be a true spherical shape, or a shape whose cross section is a hexagonal or more polygonal shape.

Accordingly, in the electromagnetic wave-shielding material or the like produced by using the ferrite powder, the filling rate of the ferrite powder can be further increased, and the absorptivity of the electromagnetic wave-shielding material or the like for electromagnetic waves (particularly, the absorptivity for electromagnetic waves in a high-frequency region of more than 1 GHz and 12 GHz or less) can be further improved.

In the present description, a true spherical shape means a true spherical shape or a shape sufficiently close to a true spherical shape, and specifically, a shape having a spherical ratio of 1 or more and 1.2 or less.

The spherical ratio is determined as follows.

First, ferrite particles are imaged at a magnification of 10,000 to 200,000 by using a scanning electron microscope (FE-SEM (SU-8020, manufactured by Hitachi High-Technologies Corporation)). Then, a circumscribed circle diameter and an inscribed circle diameter of the ferrite particles are obtained from the obtained SEM image, and a ratio thereof (circumscribed circle diameter/inscribed circle diameter) is determined as the spherical ratio. In the case where the two diameters are identical, that is, the ferrite particles have a true spherical shape, the ratio is 1.

The magnification is preferably 100,000 to 200,000 times in the case of photographing particles having a Feret's diameter (particle diameter) of 500 nm or less. The magnification is preferably 10,000 to 100,000 times in the case of photographing particles having a Feret's diameter (particle diameter) of 500 nm or more and 3 μm or less. The magnification is preferably 1,000 to 10,000 times in the case of photographing particles of more than 3 μm.

The ferrite powder may be embedded in an epoxy resin or the like and cured, and then a cross-section sample of the ferrite powder may be prepared by using an ion milling device, and photographed at the above-described magnification to calculate the spherical ratio.

Among the particles (ferrite particles) constituting the ferrite powder, the proportion of particles having a true spherical shape is preferably 90% by number or more, more preferably 91% by number or more, and still more preferably 93% by number or more.

Accordingly, the effects described above are more remarkably exhibited.

The proportion is determined by an image analysis device.

Specifically, FE-SEM (SU-8020 manufactured by Hitachi High-Technologies Corporation) and E-MAX (EDX) manufactured by Horiba, Ltd. can be combined and the proportion is measured by using the particle shape measuring function of the EDX.

The average spherical ratio of the particles (ferrite particles) constituting the ferrite powder is preferably 1 or more and 1.14 or less, and more preferably 1 or more and 1.10 or less.

Accordingly, the effects described above are more remarkably exhibited.

As the average spherical ratio, an average value of the spherical ratios obtained by determining 100 grains of particles (ferrite particles) selected at random from the ferrite powder can be adopted.

The shape of the ferrite particles is preferably a shape whose cross section is a hexagonal or more polygonal shape.

The cross-sectional shape of the ferrite is measured with FE-SEM (SU-8020 manufactured by Hitachi High-Technologies Corporation) by embedding the ferrite powder in a resin and performing cross-section processing with an ion milling device.

The BET specific surface area of the ferrite powder (specifically, the BET specific surface area of all particles constituting the ferrite powder, and the same applies hereinafter) is preferably 0.35 m$^2$/g or more and 9 m$^2$/g or less, more preferably 0.35 m$^2$/g or more and 8 m$^2$/g or less, and still more preferably 0.5 m$^2$/g or more 8 m$^2$/g or less.

Accordingly, the electromagnetic wave-shielding property (particularly, the electromagnetic wave-shielding property in a high-frequency region of more than 1 GHz and 12 GHz or less) is made particularly excellent, and the adhesion between the ferrite powder and the resin material can be made particularly excellent in the electromagnetic wave-shielding material or the like produced by using the ferrite powder, and the durability of the electromagnetic wave-shielding material or the like can be made particularly excellent.

In contrast, in the case where the BET specific surface area of all particles constituting the ferrite powder is less than the above-mentioned lower limit value, for example, it may be difficult to make the adhesion between the ferrite powder and the resin material excellent in the electromagnetic wave-shielding material or the like produced by using the ferrite powder, and the durability of the electromagnetic wave-shielding material or the like may decrease.

In addition, in the case where the BET specific surface area of all particles constituting the ferrite powder is larger than the above-mentioned upper limit value, there is a possibility that the electromagnetic wave-shielding property (particularly, the electromagnetic wave-shielding property in a high-frequency region of more than 1 GHz and 12 GHz or less) is deteriorated.

The BET specific surface area can be determined by a measurement using a specific surface area measurement device (model: Macsorb HM model-1208 (manufactured by Mauntec Corporation)).

The tap density of the ferrite powder is preferably 0.5 g/cm$^3$ or more and 3.5 g/cm$^3$ or less, and more preferably 0.5 g/cm$^3$ or more and 3.4 g/cm$^3$ or less.

Accordingly, particles having a small particle diameter and particles having a relatively large particle diameter can be suitably mixed, the particles having a small particle diameter are preferably allowed to enter gaps between the particles having a large particle diameter, and the amount of the ferrite powder filled in the electromagnetic wave-shielding material or the like can be easily increased.

In the present description, the tap density means a density obtained by the measurement in accordance with JIS Z 2512-2012.

As a tapping device, a USP tap density measurement device (Powder Tester PT-X manufactured by Hosokawa Micron Group) or the like is used.

The saturation magnetization of the ferrite powder is preferably 45 emu/g or more and 95 emu/g or less.

The ferrite powder satisfying such a condition has a large magnetic moment per unit volume and is suitable as a filler for the electromagnetic wave-shielding material or the like.

The residual magnetization of the ferrite powder is preferably 0.5 or more and 12 emu/g or less.

Accordingly, it is possible to more reliably improve the dispersibility of the ferrite powder in the resin composition.

The coercive force of the ferrite powder is preferably 25 Oe or more and 80 Oe or less.

The saturation magnetization, the residual magnetization, and the coercive force are determined by a measurement using a vibrating sample magnetic measurement device (model: VSM-C7-10A (manufactured by Toei Industry Co., Ltd.)). More specifically, first, a measurement sample is packed in a cell having an inner diameter of 5 mm and a height of 2 mm, which is set in a vibrating sample magnetic measurement device. Thereafter, an applied magnetic field is applied and swept to 5 K·1000/4π·A/m (=5 kOe), and then the applied magnetic field is reduced to create a hysteresis curve on recording paper. Then, the saturation magnetization, the residual magnetization, and the coercive force at an applied magnetic field of 5 K·1000/4π·A/m can be obtained from the data of the curve.

The electrical resistivity (also referred to as "volume resistance") of the ferrite powder at 25° C. is preferably $1\times10^6$ to $1\times10^{12}$ Ω·cm, and more preferably $1\times10^6$ to $1\times10^{10}$ Ω·cm.

The value of the volume resistance was obtained as follows. That is, first, the obtained ferrite powder was charged into a Teflon cylinder having an electrode at the bottom with an inner diameter of 22.5 mm to make the height be 4 mm. An electrode having the same size as the inner diameter was inserted from the top. The electrodes on the bottom and the top are connected to a measurement device (6517A manufactured by Keithley Corporation was used) with a load of 1 kg applied from the top, and the resistance was measured. The volume resistance was calculated by using the resistance value obtained by the measurement, the inner diameter, and the thickness.

Accordingly, for example, in the case where the ferrite particles are dispersed in a resin to produce an electromagnetic wave-shielding material or the like (resin molded body), the volume resistance of the electromagnetic wave-shielding material or the like can be maintained in a high state, and the current does not easily leak even when it is used near a location where a voltage is applied.

In the ferrite powder of the present invention, the volume-based cumulative distribution at 2.106 μm (under a sieve) is 0.1 vol % or more and 50.0 vol % or less, but ferrite particles having a particle diameter larger than 2.106 μm (2,106 nm) may also be contained.

The ferrite particles having a particle diameter larger than 2106 nm are not particularly limited, and examples thereof include ferrite particles having a particle diameter lager than 2.106 μm. Polycrystal ferrite particles are preferred.

The ferrite powder may or may not contain particles other than the ferrite particles.

The entire particles constituting the ferrite powder preferably consist of only the ferrite particles.

The ferrite particles may have a coating (surface treatment layer) provided on the surface thereof.

Accordingly, for example, the insulating property of the ferrite particles (ferrite powder) can be improved. Furthermore, for example, the dispersibility of the ferrite powder in a resin or the like can be improved.

For example, the ferrite particles may be surface-treated with a coupling agent.

Accordingly, for example, the dispersibility of the ferrite powder in a resin or the like can be improved.

As the coupling agent, for example, various silane coupling agents, titanate coupling agents, aluminate coupling agents, and the like can be used.

Particularly, in the case where the ferrite particles are treated with a silane coupling agent, the ferrite powder reliably satisfy the preferred conditions for the electrical resistivity. In addition, the aggregation of the ferrite particles can be prevented more effectively, and flowability and ease of handling of the ferrite powder and the resin composition containing the ferrite powder can be made particularly excellent. Furthermore, from the relationship of affinity between the silane coupling agent and the above-described ferrite, a surface treatment with the silane coupling agent can be more uniformly performed on each part of the ferrite particles as base particles.

For example, a silane compound having a silyl group and a hydrocarbon group can be used as the silane coupling agent. Particularly preferred is a silane coupling agent having an alkyl group having a carbon number of 8 or more and 10 or less as the alkyl group.

Accordingly, the ferrite powder further reliably satisfies the preferred conditions for the electrical resistivity. In addition, the aggregation of the ferrite particles can be prevented further effectively, and flowability and ease of handling of the ferrite powder and the resin composition containing the ferrite powder can be made further excellent. Furthermore, from the relationship of affinity between the silane coupling agent and the above-described ferrite, a surface treatment with the silane coupling agent can be further uniformly performed on each part of the ferrite particles as base particles.

The amount of the surface treatment with the silane coupling agent is preferably 0.05 mass % or more and 2 mass % or less in terms of the silane coupling agent, based on the ferrite particles (base particles).

In addition, the surface of the ferrite particles may be surface-treated with an Al compound.

Accordingly, it becomes difficult for the ferrite particles to come into contact with each other in a molded body (e.g., an electromagnetic wave-shielding material, etc.) molded by using the ferrite powder, so that it is possible to increase the electrical resistance.

Examples of the Al compound include aluminum sulfate, sodium aluminate, and the like.

The amount of the surface treatment with the Al compound is preferably 0.2 mass % or more and 1 mass % or less in terms of Al, based on the ferrite particles (base particles).

Furthermore, examples of other surface treatment agents which can be used for the surface treatment of the ferrite particles include a phosphoric acid compound, a carboxylic acid, a fluorine compound, and the like.

Examples of the phosphoric acid compound include lauryl phosphate, lauryl-2 phosphate, steareth-2 phosphate, phosphate of 2-(perfluorohexyl) ethylphosphonic acid, and the like.

As the carboxylic acid, for example, a compound (fatty acid) having a hydrocarbon group and a carboxyl group can be used. Specific examples of such compounds include decanoic acid, tetradecanoic acid, octadecanoic acid, cis-9-octadecenoic acid, and the like.

Examples of the fluorine compound include compounds having a structure in which at least a part of hydrogen atoms contained in the silane coupling agents, phosphoric acid compounds and carboxylic acids as described above are substituted with a fluorine atom (fluorine silane compounds, fluorine phosphoric acid compounds, and fluorine-substituted fatty acids), and the like.

(Method for Producing Ferrite Powder)

Next, a method for producing the ferrite powder according to the present invention will be described.

The ferrite powder according to the present invention may be produced by any method, and can be preferably produced, for example, by a method described below.

The ferrite powder of the present invention can be suitably produced, for example, by thermally spraying a ferrite raw material prepared to have a predetermined composition in the atmosphere and then rapidly solidifying the material.

In this method, a granulated product can be suitably used as the ferrite raw material.

The method for preparing the ferrite raw material is not particularly limited, and for example, a dry method or a wet method may be used.

An example of the method for preparing the ferrite raw material (granulated product) is as follows.

That is, a plurality of raw materials containing metal elements are weighed and mixed so as to correspond to the composition of the ferrite powder to be produced, and then water is added to the mixture to be pulverized to prepare a slurry. The prepared pulverized slurry is granulated with a spray dryer and classified to prepare a granulated product having a predetermined particle diameter.

Another example of the method for preparing the ferrite raw material (granulated product) is as follows.

That is, a plurality of raw materials containing metal elements are weighed and mixed so as to correspond to the composition of the ferrite powder to be produced, and then dry pulverization is performed to pulverize and disperse the raw materials. The mixture is granulated with a granulator and classified to prepare a granulated product having a predetermined particle diameter.

The granulated product prepared as described above is thermally sprayed and ferritized in the atmosphere.

As a combustion flame of a combustible gas, a mixed gas containing combustion gas and oxygen gas can be used for the thermal spraying.

The volume ratio of the combustion gas to the oxygen gas is preferably 1:3.5 or more and 1:6.0 or less.

Accordingly, the formation of ferrite particles having a relatively small particle diameter can be favorably advanced by the reprecipitation of the volatilized material. In addition, the shape (e.g., the BET specific surface area, etc.) of the finally obtained ferrite particles can be adjusted suitably. Furthermore, a treatment such as classification in the later step can be omitted or simplified, and the productivity of the ferrite powder can be made further excellent. Furthermore, the proportion of particles to be removed by classification in the later step can be further reduced, and the yield of the ferrite powder can be made further excellent.

For example, the oxygen gas can be used at a ratio of 35 $Nm^3/h$ or more and 60 $Nm^3/h$ or less to 10 $Nm^3/h$ of the combustion gas.

Examples of the combustion gas used for the thermal spraying include propane gas, propylene gas, acetylene gas, and the like. Among these, propane gas can be preferably used.

In addition, nitrogen gas, oxygen gas or air can be used as a granulated product-transporting gas for transporting the granulated product into the combustible gas.

The flow rate of the granulated product to be transported is preferably 20 m/s or more and 60 m/s or less.

In addition, the thermal spraying is preferably performed at a temperature of 1,000° C. or higher and 3,500° C. or lower, and more preferably at a temperature of 2,000° C. or higher and 3,500° C. or lower.

In the case where the above-described conditions are satisfied, the formation of ferrite particles having a relatively small particle diameter can be further favorably advanced by the reprecipitation of the volatilized material. In addition, the shape (e.g., the BET specific surface area, etc.) of the finally obtained ferrite particles can be further adjusted suitably. Furthermore, a treatment such as classification in the later step can be omitted or simplified, and the productivity of the ferrite powder can be made further excellent. Furthermore, the proportion of particles to be removed by classification in the later step can be further reduced, and the yield of the ferrite powder can be made further excellent.

The ferrite particles thus thermally sprayed and ferritized are rapidly cooled and solidified in water or the atmosphere, and are collected by a filter.

Thereafter, the ferrite particles collected by the collection filter are classified as necessary. As a classification method, a conventional air classification, mesh filtration method, sedimentation method or the like is used to adjust the particle diameter of the ferrite particles to a desired particle diameter. Particles having a large particle diameter may be removed to collect by a cyclone or the like.

With the above-described method, a ferrite powder satisfying the above-described particle diameter conditions can be efficiently produced. In addition, unlike a wet granulation method using an acid or an alkali in a production process, it is possible to effectively prevent impurities or the like derived from an acid or an alkali from remaining in the finally obtained ferrite powder, and to further improve the durability and reliability of the ferrite powder, or the resin composition and the molded body (e.g., electromagnetic wave-shielding material, etc.) produced by using the ferrite powder.

The ferrite powder of the present invention may be prepared by mixing a plurality kinds of powders (e.g., a single crystal ferrite powder containing a plurality of single crystal ferrite particles having a particle diameter of 1 nm or more and 2,000 nm or less and a polycrystal ferrite powder containing a plurality of polycrystal ferrite particles having a particle diameter larger than 2,000 nm) separately produced by different methods.

(Resin Composition)

The resin composition of the present invention contains the above-described ferrite powder of the present invention and a resin material.

Accordingly, it is possible to provide a resin composition which can be suitably used for producing an electromagnetic wave-shielding material or the like having an excellent shielding property against electromagnetic waves in a high-frequency region of more than 1 GHz and 12 GHz or less. In addition, for example, the moldability of an electromagnetic wave-shielding material or the like (molded body) as described below can be made excellent. Furthermore, the resin composition thus obtained is one in which the unintentional aggregation of the ferrite powder is stably prevented over a long period of time. Furthermore, the agglomeration of the ferrite powder and unintentional compositional variations can be prevented in the resin composition. Therefore, it is possible to effectively prevent unintentional compositional variations in the electromagnetic wave-shielding material or the like (molded body) produced by using the resin composition.

Examples of the resin material constituting the resin composition include an epoxy resin, a urethane resin, an acrylic resin, a silicone resin, various modified silicone resins (acrylic-modified one, urethane-modified one, epoxy-modified one, and fluorine-modified one), a polyamide resin, a polyimide resin, a polyamide-imide resin, fluorine, and the like. One kind can be used or two or more kinds selected from these resins can be used in combination.

The resin composition may contain components (other components) other than the ferrite powder and the resin material.

Examples of such components include a solvent, a filler (an organic filler and an inorganic filler), a plasticizer, an antioxidant, a dispersant, a colorant such as a pigment, thermally conductive particles (particles having high thermal conductivity), and the like.

The ratio (content) of the ferrite powder to the total solid content in the resin composition is preferably 50 mass % or more and 95 mass % or less, and more preferably 80 mass % or more and 95 mass % or less.

Accordingly, the dispersion stability of the ferrite powder in the resin composition, the storage stability of the resin composition, the moldability of the resin composition, and the like can be made excellent, and it is possible to further improve the mechanical strength, the electromagnetic wave-shielding property, and the like of a molded body (e.g., electromagnetic wave-shielding material, etc.) produced by using the resin composition.

The ratio (content) of the resin material to the total solid content in the resin composition is preferably 5 mass % or more and 50 mass % or less, and more preferably 5 mass % or more and 20 mass % or less.

Accordingly, the dispersion stability of the ferrite powder in the resin composition, the storage stability of the resin composition, the moldability of the resin composition, and the like can be made excellent, and it is possible to further improve the mechanical strength, the electromagnetic wave-shielding property, and the like of a molded body (e.g., electromagnetic wave-shielding material, etc.) produced by using the resin composition.

(Electromagnetic Wave-Shielding Material)

The electromagnetic wave-shielding material (molded body) of the present invention can be made of a material containing the ferrite powder of the present invention and a resin material.

Accordingly, it is possible to provide an electromagnetic wave-shielding material having an excellent shielding property against electromagnetic waves in a high-frequency region of more than 1 GHz and 12 GHz or less. In addition, the ferrite powder satisfying the above-described conditions can exhibit an excellent filler effect, and can make the electromagnetic wave-shielding material (molded body) particularly excellent in mechanical strength and the like.

The electromagnetic wave-shielding material (molded body) of the present invention can be suitably produced by using the resin composition of the present invention as described above.

Examples of the method for molding the electromagnetic wave-shielding material (molded body) include compression molding, extrusion molding, injection molding, blow molding, calender molding, and various coating methods. The electromagnetic wave-shielding material (molded body) may be formed, for example, by directly applying the resin composition onto a member on which the electromagnetic wave-shielding material (molded body) is to be formed, or may be separately prepared and then placed on a target member (e.g., a printed wiring board or a metal foil (e.g., a copper foil)).

The ferrite powder according to the present invention may be used by being mixed with and dispersed in a resin or the like without being subjected to steps such as firing, or may be used for producing a molded body (electromagnetic wave-shielding material) as a sintered body, by molding the ferrite particles into a desired shape, performing steps of granulation, coating, or the like, and then performing firing.

(Electronic Material and Electronic Component)

The electronic material and electronic component of the present invention can be made of a material containing the ferrite powder of the present invention and a resin material.

Accordingly, it is possible to provide an electronic material and an electronic component having an excellent shielding property against electromagnetic waves in a high-frequency region of more than 1 GHz and 12 GHz or less. In addition, the ferrite powder satisfying the above-described conditions can exhibit an excellent filler effect, and can make the electronic material and the electronic component particularly excellent in mechanical strength and the like.

Examples of the electronic material of the present invention include an electronic substrate, an LSI sealant, a noise suppressing paste, a noise suppressing sheet, a molding paste, and the like.

Examples of the electronic component of the present invention include an inductor, a reactor and the like.

The electronic material and the electronic component of the present invention can be suitably produced by using the resin composition of the present invention as described above.

Examples of the method for molding the electronic material and the electronic component include compression molding, extrusion molding, injection molding, blow molding, calender molding, and various coating methods. The electronic material and the electronic component may be formed, for example, by directly applying the resin composition onto a member on which the electronic material and the electronic component are to be formed, or may be separately prepared and then placed on a target member.

The ferrite powder according to the present invention may be used by being mixed with and dispersed in a resin or the like without being subjected to steps such as firing, or may be used for producing an electronic material and an electronic component as a sintered body, by molding the ferrite particles into a desired shape, performing steps of granulation, coating, or the like, and then performing firing.

The preferred embodiments of the present invention have been described above, but the present invention is not limited to thereto.

For example, the method for producing the ferrite powder of the present invention may include other steps (a pretreatment step, an intermediate step, and a posttreatment step) in addition to the steps described above, if necessary.

The ferrite powder of the present invention is not limited to the one produced by the method described above, and may be produced by any method.

In the above-described embodiment, the case where the ferrite powder and the resin composition of the present invention are used for producing an electromagnetic wave-shielding material, an electronic material, and an electronic component has been representatively described. However, the ferrite powder and the resin composition of the present invention may be used for production other than the above.

EXAMPLES

Hereinafter, the present invention will be described in detail based on Examples and Comparative Examples, but the present invention is not limited thereto. In the following description, the treatment and measurement whose temperature conditions are not specifically indicated were performed at room temperature (25° C.).

1. Production of Ferrite Powder

Ferrite powders of Examples and Comparative Examples were produced as follows.

Example 1

First, $Fe_2O_3$ and $Mn_3O_4$ as raw materials were blended at a predetermined ratio and were mixed by a Henschel mixer for 15 minutes.

The pulverized product thus obtained was pelletized by using a roller compactor, and then calcined in the air at 900° C. for 5 hours by using a rotary kiln.

After the calcination, water was added thereto and pulverization (wet pulverization) was performed to obtain a slurry. The volume average particle diameter of the powdery calcined body (calcined powder) (also referred to as raw material powder) contained in the slurry was 1.5 μm.

Next, the obtained slurry was granulated with a spray dryer and classified to obtain a granulated product having a volume average particle diameter of 5 μm.

Thereafter, thermal spraying was performed on the obtained granulated product, in a combustion flame of a combustible gas of propane gas: oxygen gas=10 $Nm^3$/hr: 35 $Nm^3$/hr at a flow rate of 40 m/sec. At this time, since the granulated product was thermally sprayed while being made flow continuously, the particles after thermal spraying and rapid cooling were independent without being bound to each other. Subsequently, the cooled particles were collected by a filter (bag filter) provided on the downstream side of the airflow and classified by an air flow classifier, to obtain a ferrite powder (Mn ferrite powder) having a predetermined volume average particle diameter and particle diameter distribution.

The volume average particle diameter and the particle diameter distribution (volume particle diameter distribution) of the ferrite powder were determined by the following measurements. That is, first, the powder as a sample: 10 g and water: 80 ml were charged into a 100 ml-beaker, and 2 drops of a dispersant (sodium hexametaphosphate) was added thereto. Next, dispersion was performed by using an ultrasonic homogenizer (Model UH-150 manufactured by SMT. Co. LTD.). At this time, the output level of the ultrasonic homogenizer was set to 4, and the dispersion was performed for 20 seconds. Thereafter, bubbles formed on the surface of the beaker were removed and the beaker was introduced into a laser diffraction type particle diameter distribution measurement device (SALD-7500 nano manufactured by Shimadzu Corporation) to perform the measurement under the previous conditions. The same measurement was made for each of Examples and Comparative Examples described later.

Electron diffraction images of the ferrite powder were observed with a transmission electron microscope (TEM) (HF-2100 Cold-FE-TEM (manufactured by Hitachi High-Technologies Corporation)) at magnifications of 100,000 and 500,000, and it was confirmed to contain single crystal ferrite particles and polycrystal ferrite particles.

The obtained ferrite powder had a volume average particle diameter of 2.84 and a BET specific surface area of 5.57 m²/g. The obtained ferrite powder had a volume-based cumulative distribution at 2.106 μm (under a sieve) of 9.71 vol %.

The BET specific surface area was determined by a measurement using a specific surface area measurement device (model: Macsorb HM model-1208 (manufactured by Mauntec Corporation)). More specifically, about 5 g of the measurement sample was charged into a standard sample cell dedicated to the specific surface area measurement device, accurate weighing was performed with a precision balance, the sample (ferrite powder) was set in a measurement port, and measurement was started. The measurement was performed by the one-point method, and when the weight of the sample was input at the end of the measurement, the BET specific surface area was automatically calculated. As a pretreatment before the measurement, about 20 g of the measurement sample was set aside on a medicine packing paper, and then, after performing degassing to −0.1 MPa with a vacuum dryer and confirming that the degree of vacuum reached −0.1 MPa or less, heating was performed at 200° C. for 2 hours. The measurement environment included temperature: 10 to 30° C., humidity: relative humidity of 20 to 80%, and no dew condensation.

The obtained ferrite powder had a tap density of 2.23 g/cm³.

The tap density was determined by using a tapping device (USP tap density measurement device, Powder Tester PT-X manufactured by Hosokawa Micron Group) in accordance with JIS Z 2512-2012. Tapping was performed at 100 times/minute for 3 minutes.

Examples 2 and 3

Ferrite powders were produced in the same manner as in Example 1 except that the classification conditions were changed.

Comparative Examples 1, 2 and 3

Ferrite powders were produced in the same manner as in Example 1 except that the conditions of the ferrite powders were set as shown in Table 2 by adjusting the ratio of the raw materials, the conditions of calcination, the conditions of granulation with a spray dryer, the conditions of thermal spraying treatment, and the classification conditions as shown in Table 1.

Example 4

The ferrite powder of this example was produced by mixing the ferrite powder obtained in Example 3 and the ferrite powder obtained in Comparative Example 1 in a mass ratio of 80:20.

The production conditions of the ferrite powders of the respective Examples and Comparative Examples are summarized in Table 1, and the configurations of the ferrite powders of the respective Examples and Comparative Examples are summarized in Table 2.

The content of each metal element constituting the ferrite powder was determined by measurement using an ICP analyzer.

More specifically, 0.2 g of the ferrite powder was weighed, and 60 mL of pure water to which 20 mL of 1N hydrochloric acid and 20 mL of 1N nitric acid were added was heated, to prepare an aqueous solution in which the ferrite powder was completely dissolved. Thereafter, the aqueous solution was measured by using an ICP analyzer (ICPS-1000IV manufactured by Shimadzu Corporation) to determine the content of each metal element.

The content of $Fe^{2+}$ in the ferrite powder was determined by redox titration with potassium permanganate.

The proportion of particles having a true spherical shape among the particles constituting the ferrite powder was determined as described above.

The true density was measured by using a fully automatic true density measurement device Macpycno manufactured by Mauntec Corporation in accordance with JIS Z 8807: 2012.

TABLE 1

| Composition of raw material (charged molar ratio) | | Method for producing raw material | Volume average particle diameter [μm] of raw material | Shape of raw material powder (primary particle) | Raw material powder (granulated product) | Supply rate (kg/Hr) of raw material powder | Method for producing ferrite powder |
|---|---|---|---|---|---|---|---|
| $Fe_2O_3$ | $Mn_3O_4$ | powder | powder | particle) | product) | powder | powder |
| Ex. 1  12 | 1 | Calcination + wet pulverization | 1.5 | Irregular shape | Spray dryer granulation (without adding binder) | 5 | Thermal spraying (raw material charging rate 5 kg/hr) + cyclone collection |

TABLE 1-continued

| | Composition of raw material (charged molar ratio) | | Method for producing raw material powder | Volume average particle diameter [μm] of raw material | Shape of raw material powder (primary particle) | Raw material powder (granulated product) | Supply rate (kg/Hr) of raw material powder | Method for producing ferrite powder |
|---|---|---|---|---|---|---|---|---|
| | $Fe_2O_3$ | $Mn_3O_4$ | | | | | | |
| Ex. 2 | 12 | 1 | Calcination + wet pulverization | 1.5 | Irregular shape | Spray dryer granulation (without adding binder) | 5 | Thermal spraying (raw material charging rate 5 kg/hr) + cyclone collection |
| Ex. 3 | 12 | 1 | Calcination + wet pulverization | 1.5 | Irregular shape | Spray dryer granulation (without adding binder) | 5 | Thermal spraying (raw material charging rate 5 kg/hr) + cyclone collection |
| Comp. Ex. 1 | 12 | 1 | Calcination + wet pulverization | 1.5 | Irregular shape | Spray dryer granulation (without adding binder) | 5 | Thermal spraying (raw material charging rate 5 kg/hr) + bag filter collection |
| Comp. Ex. 2 | 100 | 0 | Calcination + wet pulverization | 1.6 | Irregular shape | Spray dryer granulation (without adding binder) | 5 | Thermal spraying (raw material charging rate 5 kg/hr) + bag filter collection |
| Ex. 4 | Comparative Example 1 (20 mass %) + Example 3 (80 mass %) | | | | | | | |
| Comp. Ex. 3 | 12 | 1 | Calcination + wet pulverization | 1.5 | Irregular shape | Spray dryer granulation (without adding binder) | 5 | Thermal spraying (raw material charging rate 5 kg/hr) + cyclone collection |

TABLE 2

| | Composition [mass %] of particles of obtained ferrite powder | | Amount of $Fe^{2+}$ | Volume average particle diameter and particle diameter distribution of obtained ferrite powder | | | Volume-based cumulative distribution at 2.106 μm (under sieve) | Proportion of particle having true spherical shape | BET specific surface area | Tap density | True density |
|---|---|---|---|---|---|---|---|---|---|---|---|
| | Fe | Mn | | Volume average particle diameter [μm] | D90 [μm] | D10 [μm] | [vol %] | [% by number] | [$m^2$/g] | [g/$cm^3$] | [g/$cm^3$] |
| Ex. 1 | 62.0 | 7.9 | 0.67 | 2.84 | 4.24 | 1.95 | 9.71 | 91 | 5.57 | 2.23 | 4.84 |
| Ex. 2 | 63.3 | 8.0 | 2.17 | 4.71 | 10.57 | 2.795 | 0.71 | 97 | 0.68 | 2.86 | 4.95 |
| Ex. 3 | 62.7 | 7.3 | 3.24 | 7.31 | 13.44 | 3.579 | 0.22 | 99 | 0.65 | 2.96 | 4.95 |
| Comp. Ex. 1 | 61.5 | 7.7 | 0.89 | 0.088 | 0.047 | 0.761 | 100.00 | 70 | 10.50 | 1.54 | 4.82 |
| Comp. Ex. 2 | 68.4 | 0.4 | 1.40 | 0.170 | 0.076 | 0.968 | 100.00 | 68 | 14.09 | 1.62 | 4.72 |
| Ex. 4 | 63.0 | 7.9 | 1.7 | 5.89 | 10.77 | 3.057 | 20.18 | 93 | 3.34 | 2.54 | 4.92 |
| Comp. Ex. 3 | 62.5 | 8.1 | 4.62 | 21.42 | 33.62 | 12.52 | 0.00 | 92 | 0.33 | 3.56 | 4.98 |

2. Viscosity Measurement

In a rotation and revolution type mixer, 70 parts by mass of the ferrite powder obtained in each of Examples and Comparative Examples and 30 parts by mass of a polyvinyl alcohol (PVA) aqueous solution (solid content:10 mass %) were dispersed and mixed for 3 minutes, and then the viscosity of the obtained mixture was measured with a B-type viscometer. Regarding the measurement of the viscosity, the viscosity at the 1st rotation and the viscosity at the 10th rotation were measured and evaluated.

3. Magnetic Permeability of Ferrite Powder (1 MHz to 1 GHz)

The magnetic permeability of the ferrite powder of each of Examples and Comparative Examples was measured as follows. The measurement of the magnetic permeability was performed by using an E4991 A type RF impedance/material analyzer 16454A magnetic material measurement electrode, manufactured by Agilent Technologies. First, 4.5 g of the ferrite powder and 0.5 g of a fluorine powder resin were put into a 100 cc-polyethylene container and stirred with a ball mill at 100 rpm over 30 minutes for mixing. After the completion of the stirring, about 0.8 g of the obtained mixture was filled into a die having an inner diameter of 4.5 mm and an outer diameter of 13 mm, and pressurized with a press machine at a pressure of 40 MPa for 1 minute. The obtained molded body was heated and hardened by a hot air drier at a temperature of 140° C. for 2 hours to obtain a measurement sample. Then, the measurement sample was set in the measurement device, and the outer diameter, inner diameter and height of the measurement sample measured in advance were input to the measurement device. In the measurement, the amplitude was set to 100 mV, the range of the frequency of 1 MHz to 3 GHz was swept in a logarithmic scale, and the magnetic permeability (the real part μ' of the complex magnetic permeability) was measured.

4. Measurement of Magnetic Permeability in More than 1 GHz and 12 GHz or Less

Seventy parts by mass of the ferrite powder was mixed with 30 parts by mass of an epoxy resin, then the mixture was poured into a cylindrical mold having an inner diameter of 1.8 mm and a length of 100 mm, and then cured by heating. After returning the mold to room temperature, a round bar-shaped sample was taken out from the mold and used as a magnetic permeability measurement sample.

The obtained sample was set in a resonator, and the magnetic permeability was measured by using a cavity resonator (for S band and C band (both manufactured by KANTO Electronic Application and Development Inc.)) and a network analyzer (E5071C manufactured by Keysight Technologies).

4-1. Frequency at which μ' was 1 or Less

From the above-mentioned measurement results, the frequency at which μ' was 1 or less was determined in the region where the frequency was more than 1 GHz and 12 GHz or less.

5. Saturation Magnetization, Residual Magnetization, and Coercive Force

The saturation magnetization, the residual magnetization, and the coercive force of the ferrite powder of each of Examples and Comparative Examples were determined.

The saturation magnetization, the residual magnetization, and the coercive force were determined as follows. That is, first, the ferrite powder was packed in a cell having an inner diameter of 5 mm and a height of 2 mm, which was set in a vibrating sample magnetic measurement device (VSM-C7-10A manufactured by Toei Industry Co., Ltd.). Next, an applied magnetic field was applied and swept to 5 K·1000/4π·A/m, and then the applied magnetic field was reduced to create a hysteresis curve. Thereafter, the saturation magnetization, the residual magnetization, and the coercive force were determined from data of the curve.

6. Volume Resistance

The value of volume resistance was obtained as follows. That is, first, the obtained ferrite powder was charged into a Teflon cylinder having an electrode at the bottom with an inner diameter of 22.5 mm to make the height be 4 mm. An electrode having the same size as the inner diameter was inserted from the top. The electrodes on the bottom and the top were connected to a measurement device (6517A manufactured by Keithley Corporation was used) with a load of 1 kg applied from the top, and the resistance was measured. The volume resistance was calculated using the resistance value obtained by the measurement, the inner diameter, and the thickness.

The results are summarized in Table 3.

removed to obtain a sheet-shaped molded body (electromagnetic wave-shielding material) having a thickness of 1 mm.

The obtained molded body (electromagnetic wave-shielding material) was evaluated for electromagnetic wave-shielding capacity, and excellent results were obtained in the present invention. Specifically, the molded body obtained above was cut into a length of 200 mm×width of 200 mm×thickness of 5 mm, and measured by a transmission attenuation factor measurement method (micro-strip line) in accordance with IEC62333.

(Measurement Range)
1 to 18 GHz
(Measurement Jig)
Micro strip line jig
(Network Analyzer)
Anritsu 37247C Representatively, the FIGURE shows the measurement results of the molded body produced by using the ferrite powder of Example 2.

INDUSTRIAL APPLICABILITY

The Mn ferrite powder of the present invention contains a plurality of ferrite particles, and has a volume average particle diameter of 1 μm or more and 10 μm or less and a volume-based cumulative distribution at 2.106 μm (under a sieve) of 0.1 vol % or more and 50.0 vol % or less. Therefore, it is possible to provide a ferrite powder, which has an excellent shielding property against electromagnetic waves in a low-frequency region of 1 GHz or less, and has excellent shielding property against electromagnetic waves in a high-frequency region of more than 1 GHz and 12 GHz or less. Therefore, the ferrite powder of the present invention has industrial applicability.

TABLE 3

| | Paste viscosity | | Value of magnetic permeability μ' | | | Frequency (GHz) at which μ' is 1 or less at 1 GHz or more | Magnetic characteristics (VSM at 5 kOe) | | | Volume resistance (Ω · cm) |
| | 1st rotation | 10th rotation | 1 MHz | 10 MHz | 100 MHz | | Saturation magnetization (emu/g) | Residual magnetization (emu/g) | Coercive force (Oe) | |
|---|---|---|---|---|---|---|---|---|---|---|
| Ex. 1 | 70,000 | 60,000 | 10 | 10 | 10 | Between 4.664 and 5.108 GHz | 79.4 | 5.8 | 59 | 1.7 × 10¹⁰ |
| Ex. 2 | 20,000 | 10,000 | 7 | 7 | 6.5 | Between 5.108 and 5.604 GHz | 77.1 | 2.8 | 41 | 5.5 × 10⁸ |
| Ex. 3 | 10,000 | 4,000 | 6 | 6 | 5 | Between 5.604 and 6.139 GHz | 78.1 | 3.5 | 50 | 1.4 × 10⁸ |
| Comp. Ex. 1 | 125,000 | 100,000 | 9 | 9 | 9 | Between 3.439 and 3.809 GHz | 72.2 | 8.4 | 85 | 6.1 × 10¹⁰ |
| Comp. Ex. 2 | 120,000 | 110,000 | 3 | 3 | 3 | Between 3.994 and 4.286 GHz | 66.2 | 11.1 | 105 | 1.3 × 10⁸ |
| Ex. 4 | 95,000 | 85,000 | 7.5 | 7.5 | 7 | Between 5.108 and 5.604 GHz | 76.9 | 4.5 | 57 | 3.5 × 10⁹ |
| Comp. Ex. 3 | 7,000 | 2,000 | 4.5 | 4 | 2.5 | Between 5.108 and 5.604 GHz | 87.8 | 2.9 | 40 | 1.5 × 10⁶ |

As is clear from Table 3, excellent results were obtained in the present invention, whereas satisfactory results were not obtained in Comparative Examples.

In each of Examples, the ferrite powder, the powdery PVA as a resin material, and water as a solvent were dispersed and mixed at a mass ratio of 70:30:270 to obtain a resin dispersion liquid.

Thereafter, the resin dispersion liquid was poured into a flat plate-shaped molding container and the solvent was Although the present invention has been described in detail with reference to specific embodiments, it will be apparent to those skilled in the art that various modifications and variations are possible without departing from the spirit and scope of the present invention.

The invention claimed is:

1. A Mn ferrite powder,
comprising a plurality of ferrite particles,
having a volume average particle diameter of 2.84 μm or more and 10 μm or less, and having a volume-based cumulative distribution at 2.106 μm (under a sieve) of 0.1 vol % or more and 50.0 vol % or less.

2. The Mn ferrite powder according to claim 1, having a BET specific surface area of 0.35 m$^2$/g or more and 9 m$^2$/g or less.

3. The Mn ferrite powder according to claim 1, wherein the ferrite particles have a true spherical shape, or a shape whose cross section is a hexagonal or more polygonal shape.

4. The Mn ferrite powder according to claim 1, having a Mn content of 4 mass % or more and 13 mass % or less, and a Fe content of 60 mass % or more and 68 mass % or less.

5. A resin composition, comprising the Mn ferrite powder as described in claim 1 and a resin material.

6. An electromagnetic wave-shielding material, formed of a material comprising the Mn ferrite powder as described in claim 1 and a resin material.

7. An electronic material, formed of a material comprising the Mn ferrite powder as described in claim 1.

8. An electronic component, formed of a material comprising the Mn ferrite powder as described in claim 1.

* * * * *